(12) United States Patent
Enomoto et al.

(10) Patent No.: US 6,685,539 B1
(45) Date of Patent: Feb. 3, 2004

(54) PROCESSING TOOL, METHOD OF PRODUCING TOOL, PROCESSING METHOD AND PROCESSING APPARATUS

(75) Inventors: Toshiyuki Enomoto, Tokyo (JP); Yasuhiro Tani, Tokyo (JP); Shigeru Inoue, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 140 days.

(21) Appl. No.: 09/639,239

(22) Filed: Aug. 16, 2000

(30) Foreign Application Priority Data

| Aug. 24, 1999 | (JP) | 11-237467 |
|---|---|---|
| Sep. 14, 1999 | (JP) | 11-260799 |
| Sep. 30, 1999 | (JP) | 11-278608 |
| Oct. 28, 1999 | (JP) | 11-306335 |

(51) Int. Cl.$^7$ ................................. B24B 1/00
(52) U.S. Cl. .................... 451/41; 451/57; 451/59; 451/65; 451/296; 451/526; 451/541; 451/550
(58) Field of Search ................ 451/526, 299, 451/296, 548, 65, 540, 541, 550, 28, 41, 63, 57, 59

(56) References Cited

U.S. PATENT DOCUMENTS

| 3,657,845 A | * | 4/1972 | Sekiya ...................... 451/541 |
| 3,852,078 A | * | 12/1974 | Wakatsuki et al. ........... 501/92 |
| 3,867,795 A | * | 2/1975 | Ameigh ...................... 114/109 |
| 4,997,461 A | * | 3/1991 | Markhoff-Matheny et al. ...................... 51/293 |
| 5,104,422 A | * | 4/1992 | St. Pierre .................... 51/295 |
| 5,233,794 A | * | 8/1993 | Kikutani et al. ............. 451/546 |
| 5,549,961 A | * | 8/1996 | Haas et al. .................. 428/143 |
| 5,658,189 A | * | 8/1997 | Kagamida ................... 451/194 |
| 6,332,831 B1 | * | 12/2001 | Shemo et al. ................ 106/3 |

FOREIGN PATENT DOCUMENTS

| JP | 5-006881 | 1/1993 |
| JP | 5-013388 | 1/1993 |
| JP | 5-023959 | 2/1993 |
| JP | 5-123952 | 5/1993 |
| JP | 5-152260 | 6/1993 |
| JP | 5-243196 | 9/1993 |
| JP | 5-285843 | 11/1993 |
| JP | 5-285844 | 11/1993 |
| JP | 5-285847 | 11/1993 |
| JP | 6-210520 | 8/1994 |
| JP | 7-001322 | 1/1995 |
| JP | 7-050279 | 2/1995 |
| JP | 7-058065 | 3/1995 |
| JP | 7-100748 | 4/1995 |
| JP | 7-124853 | 5/1995 |
| JP | 7-171749 | 7/1995 |
| JP | 7-237100 | 9/1995 |
| JP | 8-090401 | 4/1996 |
| JP | 8-118226 | 5/1996 |
| JP | 8-168946 | 7/1996 |
| JP | 8-168947 | 7/1996 |
| JP | 8-197400 | 8/1996 |
| JP | 8-236489 | 9/1996 |
| JP | 8-236490 | 9/1996 |
| JP | 8-276366 | 10/1996 |
| JP | 9-047969 | 2/1997 |
| JP | 9-057584 | 3/1997 |
| JP | 9-057585 | 3/1997 |
| JP | 9-076148 | 3/1997 |
| JP | 9-094746 | 4/1997 |
| JP | 9-123050 | 5/1997 |
| JP | 10-029142 | 2/1998 |
| JP | 10-044007 | 2/1998 |
| JP | 10-071549 | 3/1998 |
| JP | 10-166259 | 6/1998 |
| JP | 10-189508 | 7/1998 |
| JP | 10-328989 | 12/1998 |
| JP | 10-329032 | 12/1998 |
| JP | 11-070450 | 3/1999 |
| JP | 11-207611 | 8/1999 |
| JP | 2000-176842 | 6/2000 |
| JP | 2000-190228 | 7/2000 |

\* cited by examiner

*Primary Examiner*—Joseph J. Hail, III
*Assistant Examiner*—Hadi Shakeri
(74) *Attorney, Agent, or Firm*—Oblon, Spivak, McClelland, Maier & Neustadt, P.C.

(57) ABSTRACT

A processing tool is used to carry out a fixed-abrasive grinding process on a surface of a silicon work-piece. The processing tool includes abrasive grains made up silica grains. A primary average grain size of the silica grains is desirably 0.8 nm to 10 μm.

9 Claims, 7 Drawing Sheets

PROCESSING TOOL, METHOD OF PRODUCING TOOL, PROCESSING METHOD AND PROCESSING APPARATUS

CROSS-REFERENCE TO RELATED APPLICATIONS

This application claims the benefit of Japanese Patent Applications No.11-237467 filed Aug. 24, 1999, No.11-260799 filed Sep. 14, 1999, No.11-278608 filed Sep. 30, 1999 and No.11-206355 filed Oct. 28, 1999, in the Japanese Patent Office, the disclosures of which are hereby incorporated by reference.

BACKGROUND OF THE INVENTION

1. Field of the Invention

The present invention generally relates to processing tools, methods of producing processing tools, processing methods and processing apparatuses, and more particularly to a processing tool which is used to grind a work-piece made of silicon or the like, a method of producing such a processing tool, a processing method for processing a peripheral part of a work-piece, and a processing apparatus

2. Discussion of Background

Conventionally, in a finishing process of a silicon wafer, a polishing process uses colloidal silica as the slurry and a flexible polishing cloth as the polishing tool. However, since the polishing process uses the slurry, there are problems in that the processing environment is harsh, the waste water must be processed, the running cost of the processing system is high, the processing efficiency is low, and the shaping accuracy (flatness) is poor. For this reason, there are demands to carry out the finishing process of the silicon wafer by a fixed-abrasive machining apparatus, that is, by use of a fixed-abrasive grinding tool such as a grindstone and a polishing film, and various tools therefor have been proposed.

As conventional techniques which utilize the mechano-chemical reaction between barium carbonate and silicon, there is a first conventional technique proposed in a Japanese Laid-Open Patent Application 5-285844, a second conventional technique proposed in a Japanese Laid-Open Patent Application No.5-285847, and a third conventional technique proposed in a Japanese Laid-Open Patent Application No.10-329032.

According to the first through third conventional techniques, the grindstone is formed by abrasive grains which are made of barium carbonate. By utilizing the mechano-chemical reaction that occurs between the abrasive grains and silicon, a processed surface having a high quality is obtained, similarly to a case where a loose-abrasive polishing process is carried out, such that no residual damage remains after the processing. In other words, it is possible, by using the barium carbonate for the abrasive grains, to replace the conventional polishing process by the grinding process.

On the other hand, silica generates a mechano-chemical reaction with respect to silicon. In addition, since the constituent elements of silica are silicon and oxygen, silica will not form on the silicon a residual contamination resulting from the mechano-chemical reaction between the silica and the silicon. Furthermore, since the mechanical hardness of silica is higher than that of barium carbonate, it is possible to realize a high removing efficiency while maintaining the high accuracy of the processed surface.

For example, in a fourth conventional technique proposed in a Japanese Laid-Open Patent Application No.8-276366, a resin bonded grindstone is produced by using silica as the aggregate. In fifth, sixth and seventh conventional techniques respectively proposed in Japanese Laid-Open Patent Applications No.5-285843, No.10-166259 and No.9-47969, the grindstone for grinding a sapphire substrate uses silica for the abrasive grains.

According to the fourth conventional technique, silica is not used for the abrasive grains, but is used for the aggregate, so as to improve the dispersibiity of the abrasive grains and improve the adjustment of the specific gravity of the binder.

According to the fifth and sixth conventional techniques, the grindstone for grinding sapphire is formed by using silica which is mechanically softer than sapphire. A high-quality grinding of sapphire is realized by utilizing the mechano-chemical reaction at a point of contact between the abrasive grains and the sapphire.

According to the seventh conventional technique, ultra-fine silica or silicon oxide powder having a grain diameter of several tens of nm or less is used as the abrasive grains. A silicon wafer or the like is mirror finished with a high accuracy without loading, by use of the grindstone which is formed at a predetermined porosity. It is, however, not the main object of the seventh conventional technique to generate the mechano-chemical reaction by the use of the silica abrasive grains.

When barium carbonate is used for the abrasive grains as in the case of the first through third conventional techniques, the mechano-chemical reaction between the barium carbonate and the silicon causes a compound thereof to be generated on the silicon as residual contamination. The compound is made up of barium, silicon and oxygen. Hence, the generated contamination deteriorates the quality of the processed surface, and it is necessary to carry out a cleaning process as an after-process. Moreover, the barium carbonate has a mechanical hardness lower than that of the silicon and is easier to process the barium carbonate with a high accuracy, but as a consequence, the removing efficiency is too low for use during the production process.

On the other hand, as in the case of the fourth conventional technique, silica is generally used as the aggregate, so as to improve the dispersibiity of the abrasive grains and improve the adjustment of the specific gravity of the binder, when carrying out the process using the resin bonded grindstone. In the fifth and sixth conventional techniques, silica is used as the abrasive grains for polishing sapphire, but no consideration is given on the use of silica as the abrasive grains for polishing a silicon wafer. Further, since the seventh conventional technique uses the silica powder having a grain diameter of several tens of nm or less, it is difficult to realize a high removing efficiency.

SUMMARY OF THE INVENTION

Accordingly, it is a general object of the present invention to provide a novel and useful processing tool, method of producing processing tool, processing method and processing apparatus, in which the problems described above are eliminated.

Another and more specific object of the present invention is to provide a processing tool, method of producing processing tool, processing method and processing apparatus, which use silica abrasive grains to generate a mechano-chemical reaction with respect to silicon but prevents residual contamination from remaining on the silicon due to the mechano-chemical reaction.

Still another object of the present invention is to provide a processing tool for carrying out a fixed-abrasive grinding process on a surface of a silicon work-piece, comprising abrasive grains made up silica grains. According to the processing tool of the present invention, it is possible to utilize the mechano-chemical reaction generated by the silica grains on the silicon work-piece, and realize a high removing efficiency while maintaining a high quality of the processed surface.

A further object of the present invention is to provide a method of producing a processing tool having abrasive grains for carrying out a fixed-abrasive grinding process on a surface of a silicon work-piece, comprising the step of (a) mixing a binder and silica grains to form a mixture, and (b) forming the mixture into the abrasive grains of the processing tool. According to the method of the present invention, it is possible to produce a processing tool which utilizes the mechano-chemical reaction generated by the silica grains on the silicon work-piece, to realize a high removing efficiency while maintaining a high quality of the processed surface.

Another object of the present invention is to provide a processing method for carrying out a fixed-abrasive grinding process on a surface of a silicon work-piece, comprising the steps of (a) positioning the silicon work-piece relative to a processing tool having abrasive grains made up silica grains, and (b) processing the surface of the silicon work-piece by the abrasive grains of the processing tool. According to the processing method of the present invention, it is possible to utilize the mechano-chemical reaction generated by the silica grains on the silicon work-piece, to realize a high removing efficiency while maintaining a high quality of the processed surface.

Still another object of the present invention is to provide a processing method for carrying out a process on a disk-shaped or donut-shaped work-piece, comprising the steps of (a) grinding an outer peripheral surface of the work-piece by a grindstone, and (b) polishing cutout part on the outer peripheral surface of the work-piece and/or an inner peripheral surface of the work-piece by a polishing film. According to the processing method of the present invention, it is possible to stably and suitably process various kinds of surfaces of the work piece with a high efficiency, so as to obtain processed surfaces having a high quality, at a low running cost.

A further object of the present invention is to provide a processing apparatus for carrying out a process on a disk-shaped or donut-shaped work-piece, comprising a grinding unit grinding an outer peripheral surface of the work-piece by a grindstone, a polishing unit polishing cutout part on the outer peripheral surface of the work-piece and/or an inner peripheral surface of the work-piece by a polishing film, and a transport unit transporting the work-piece at least between the grinding unit and the polishing unit and positioning the work-piece in the grinding unit and the polishing unit. According to the processing apparatus of the present invention, it is possible to stably and suitably process various kinds of surfaces of the work piece with a high efficiency, so as to obtain processed surfaces having a high quality, at a low running cost.

Other objects and further features of the present invention will be apparent from the following detailed description when read in conjunction with the accompanying drawings.

DESCRIPTION OF THE PREFERRED EMBODIMENTS

Figure 1:
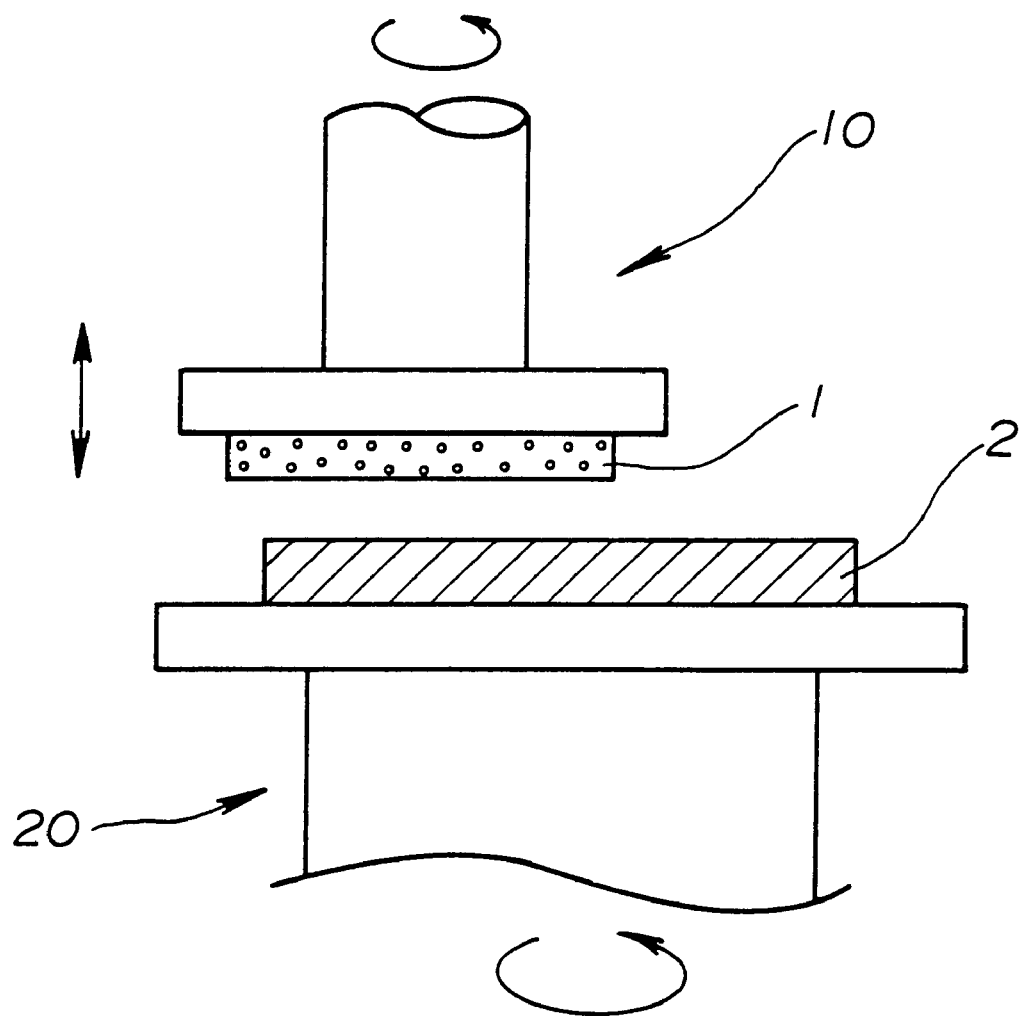
FIG. 1 is a diagram for explaining a second embodiment of a processing apparatus according to the present invention.

A description will be given of a first embodiment of a method of producing processing tool according to the present invention. This first embodiment of the method of producing processing tool produces a first embodiment of a processing tool according to the present invention. In this embodiment, a grindstone of the processing tool uses silica which generates a mechano-chemical reaction with respect to silicon.

In this embodiment of the method of producing the processing tool, this embodiment of the processing tool is produced by a mixing step and a forming step. The mixing step mixes silica and a liquid resin, together with an additive such as a solid lubricant if necessary. The mixture is stirred, so as to obtain a binder resin (mixture) which includes silica abrasive grains.

Silica generates a mechano-chemical reaction with respect to silicon. However, since the constituent elements of silica are silicon and oxygen, silica will not form on the silicon a residual contamination resulting from the mechano-chemical reaction between the silica and the silicon. Further, silica has a satisfactory mechanical hardness which is higher than that of barium carbonate, such that a high removing efficiency can be realized while maintaining the surface quality of a processed surface high when the silica processing tool is used to process the surface of a work-piece.

In this case, the silica content in the abrasive grains is 10 to 70 volume percent (%), and an average grain diameter of silica is 0.8 nm to 10 $\mu$m.

If the silica content in the abrasive grains is less than 10 volume %, the silica abrasive grains do not generate the desired reaction on silicon. On the other hand, if the silica content in the abrasive grains exceeds 70 volume %, the loading of the grindstone occurs, and the processing easily becomes unstable. In this latter case, the amount of binder also becomes insufficient, and there is a possibility that a desired tool strength required to process the work-piece is not be obtainable.

If the average grain diameter used for the grindstone of the processing tool is less than 0.8 nm, the mechanical action on the work-piece becomes too small, and a desired mechano-chemical reaction cannot be generated. On the other hand, if the average grain diameter used for the grindstone exceeds 10 $\mu$m, the mechanical action becomes too large, and there is a possibility of generating damage to the processing surface of the work-piece, such as a silicon wafer surface.

On the other hand, the binder material is not limited to a resin, and various other materials such as ceramics, metals, silicate and magnesia may be used depending on the object of the processing which is to be carried out by use of the processing tool. It is desirable that the binder material does not generate an endothermic reaction during the processing. For example, polymer materials such as phenol resins and polyimide resins may be used for the binder material.

As described above, silica generates the mechano-chemical reaction with respect to silicon. But it is necessary that a processing ambient temperature is sufficiently high so that the chemical reaction of the mechano-chemical reaction occurs. If the binder is made of a material such as an acrylic resin which has a low melting point, the binder will melt due to heat which is generated during the process carried out with respect to the work-piece, and the endothermic reaction generated by the melting of the binder causes the processing ambient temperature to decrease. Consequently, it would become impossible to generate the mechano-chemical reaction at the decreased processing ambient temperature.

Therefore, the use of ceramics, metals and polymer materials such as phenol resins and polyimide resins as the binder prevents the binder from melting during the process carried out with respect to the work-piece, which would thereby cause the endothermic reaction that will decrease the processing ambient temperature.

Of course, it is possible not to include the binder in the mixture. In this case, the silica abrasive grains are mutually bonded by siloxane bonding to form the processing tool.

If necessary, the additive is added to improve the strength and/or lubrication of the processing tool. The additive is also desirably made of a material which does not generate an endothermic reaction during the processing, since the endothermic reaction would decrease the processing ambient temperature and thereby make it impossible to generate the mechano-chemical reaction between silica and silicon. For example, materials such as carbon and molybdenum disulfide may be used for the additive. The use of such materials for the additive ensures generation of the mechano-chemical reaction, by preventing the additive from melting and generating the endothermic reaction during the process which is carried out with respect to the work-piece.

The forming step is carried out after the mixing step ends. The forming step forms the grindstone by employing an abrasive machining method which suits the binder used.

When making a resin bonded grindstone or a vitrified grindstone, the mixture which is obtained by the mixing step is subjected to a pressurized baking and drying. Alternatively, a technique employing the electrophoretic effect as taught in a Japanese Laid-Open Patent Application No.2000-176842 may be employed. When making a metal bonded grindstone, electrodeposition, hot pressing or the like is employed. Furthermore, when producing a film-shaped processing tool, a coating step is carried out prior to the forming step, so as to coat a binder resin (mixture) on a resin film. In this coating step, the mixture is coated on a base material, that is, a resin film, which is made of polyethylene telephthalate, for example.

The base material used to produce the film-shaped processing tool is not limited to polyethylene telephthalate film, and various other materials may be used. Such various other materials include plastic films made of polyimide, polycarbonate and the like, synthetic paper, nonwoven fabric, and metal film.

The coating step which coats the mixture on the base material may employ a wire bar coater, a gravure coater, a reverse roller coater, a knife coater or the like.

A first embodiment of a processing method which processes a work-piece employs this embodiment of the processing tool which is produced in the above described manner. More particularly, the processing tool is used to carry out a fixed-abrasive machining process with respect to a work-piece, namely, a silicon wafer. The fixed-abrasive machining process may be applied to a grinding process which grinds the surface of the wafer, a polishing film process which polishes the surface of the wafer, a grinding process which grinds the outer peripheral surface of the wafer, a polishing film process which polishes the outer peripheral surface of the wafer, and the like.

In this fixed-abrasive machining process, a grindstone made of silica abrasive grains or a polishing film made of silica abrasive grains is mounted on a first embodiment of a processing apparatus according to the present invention, and the work-piece is ground to a predetermined dimension.

The processing apparatus used is not limited to a specific type. Any type of processing apparatus appropriate for the type of processing tool used may be employed for the fixed-abrasive machining process.

This embodiment of the processing method uses the silica abrasive grains so that the silicon processing surface of the work-piece is processed with an extremely high surface quality, free of damage caused by the processing, that is, without generating residual contamination at the processed surface. As a result, compared to the polishing process which is conventionally used to finish the surface of the silicon wafer, this embodiment of the processing method can obtain a comparable processing surface quality at a much higher efficiency. In addition, this embodiment of the processing method can realize a high shaping accuracy (flatness). On the other hand, since this embodiment of the processing method does not use loose-abrasive slurry as in the case of the polishing process, the environment is unaffected by the process, and the running cost of the processing apparatus can be reduced.

Next, a description will be given of a second embodiment of the processing tool according to the present invention and a second embodiment of the method of producing the second embodiment of the processing tool.

This second embodiment of the method of producing the processing tool mixes fumed silica having an average grain diameter of 30 nm and a wetting agent into a liquid acrylic resin, with the volume % of the fumed silica grains being set to 50%. A resulting mixture is stirred and mixed in a homogenizer for 5 minutes. A binder resin which is obtained by this stirring and mixing, is subjected to a pressurized baking for 30 minutes at a pressure of 50 MPa and a heating temperature of 150° C. The baked binder resin is further dried for 20 minutes to remove volatile components, and a resin bonded grindstone made of silica abrasive grains is obtained. In this case, the kind of binder used is not limited to a specific resin, and it is possible to use instead any material such as resins, ceramics and metals which will not generate an endothermic reaction when the resin bonded grindstone is used to process the work-piece. In addition, the kind of method used to form the resin bonded grindstone may be appropriately selected to suit the kind of binder used. Furthermore, the additive (wetting agent) is also made of a material which will not generate an endothermic reaction when the resin bonded grindstone is used to process the work-piece.

This second embodiment of the processing tool which includes the resin bonded grindstone described above, is used in a second embodiment of the processing method which processes a work-piece. More particularly, the resin bonded grindstone is mounted on a vertical infeed grinding machine, and is used to grind the surface of the work-piece which is a 8-inch diameter silicon wafer which has already been lapped. By grinding the wafer surface for 30 seconds with a machining allowance of 30 $\mu$m, it was possible to obtain a processed surface having a high quality such that the surface roughness is 1 nm Ry or less and the processed surface is microcrack-free when viewed on a profile transmission electron microscope (TEM).

FIG. 1 is a diagram for explaining a second embodiment of the processing apparatus according to the present invention, which employs this second embodiment of the processing method. In FIG. 1, a grindstone 1 is mounted in a ring-shape on a rotary grinder 10 of a vertical infeed grinding machine. A silicon wafer 2 which forms the work-piece is placed and held on a work-piece holder 20. The rotary grinder 10 rotates at a predetermined speed, and the work-piece holder 20 rotates in the same direction as the rotary grinder 10 but at a speed lower than the predetermined speed. The work-piece holder 20 rotates about a rotary axis different from that of the rotary grinder 10, and feeds the silicon wafer 2 to a grinding position at a constant speed, so as to continuously grind the surface of the silicon wafer 2 to a desired dimension.

Next, a description will be given of a third embodiment of the processing tool according to the present invention and a third embodiment of the method of producing the third embodiment of the processing tool.

This third embodiment of the method of producing the processing tool mixes colloidal silica having an average grain diameter of 80 nm into a liquid urethane resin, with the volume % of the colloidal silica grains being set to 65%. A resulting mixture is stirred and mixed in a homogenizer for 5 minutes. A binder resin which is obtained by this stirring and mixing, is coated on a polyethylene telephthalate film to a thickness of 3 μm. This film which is coated with the binder resin is heated for 10 minutes, and subjected to a drying and curing processes, so as to obtain a polishing film.

This third embodiment of the processing tool which includes the polishing film described above, is used in a third embodiment of the processing method which processes a work-piece. More particularly, the polishing film is used to polish the outer peripheral surface of the 6-inch diameter silicon wafer. After 2 minutes of polishing, it was possible to polish the outer peripheral surface of the silicon wafer to a processed surface having a high quality which is free of scratches.

Figure 2:
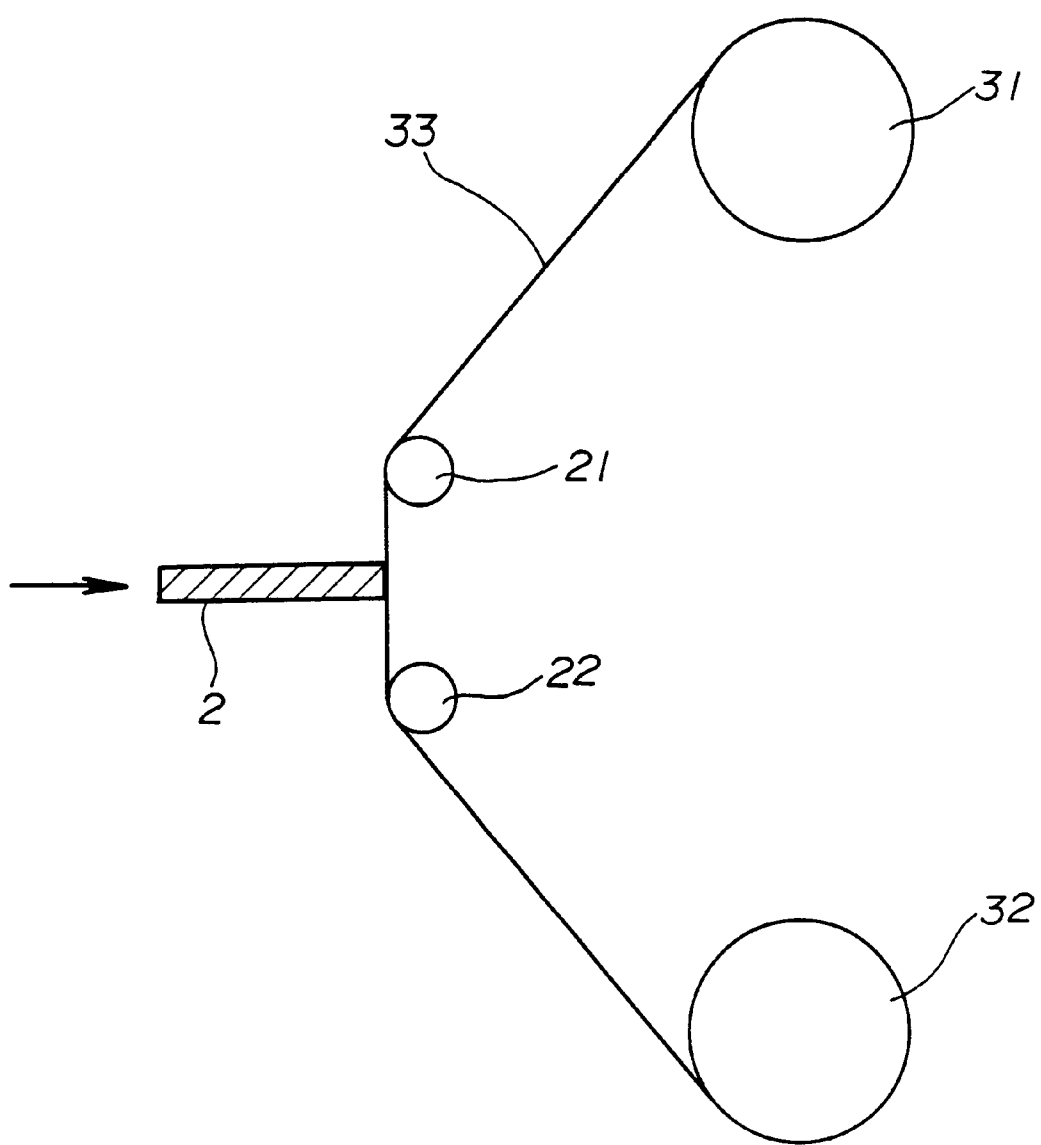
FIG. 2 is a diagram for explaining a third embodiment of the processing apparatus according to the present invention.

FIG. 2 is a diagram for explaining a third embodiment of the processing apparatus according to the present invention, which employs this third embodiment of the processing method. In FIG. 2, a polishing film 33 is provided between a supply spool 31 and a take-up spool 32 via rollers 21 and 22. The outer peripheral surface of the silicon wafer 2 is pushed against the polishing surface of the polishing film 33, between the rollers 21 and 22. The polishing film 33 is supplied from the supply spool 31 and taken up on the take-up spool 32, by driving at least the take-up spool 32 by a known driving means such as a motor, so as to polish the outer peripheral surface of the silicon wafer 2. Of course, it is possible to drive both the take-up spool 32 and the supply spool 31, so that the polishing film 33 is moved back and forth instead of being transported in only one direction from the supply spool 31 to the take-up spool 32.

The silicon wafer 2 may assume a fixed position relative to the polishing film 33 during the polishing process or, may be controlled to push against the polishing film 33 with a controlled pressure.

Next, a description will be given of a fourth embodiment of the processing tool according to the present invention and a fourth embodiment of the method of producing the fourth embodiment of the processing tool.

This fourth embodiment of the method of producing the processing tool mixes colloidal silica having an average grain diameter of 30 nm and a binder into a solvent, with the volume % of the colloidal silica grains being set to 20%. A water-soluble polymer is used as the binder, with the volume % of the water-soluble polymer being set to 30 volume %. Water is used as the solvent, with the volume % of the water being set to 50 volume %. A resulting mixture is stirred and mixed at a low speed in a state where a D.C. voltage of 10 V is applied across an anode and a cathode which are inserted into the mixture, and the electrophoresis is carried out for 60 minutes. An abrasive grain layer having a thickness on the order of approximately 5 mm is formed around the anode, and this abrasive grain layer is removed from the anode to form a grindstone pellet having a thickness of 5 mm. Thereafter, this grindstone pellet is dried at a temperature of 100° C. for 1 hour, so as to finally obtain a resin bonded grindstone made of silica abrasive grains.

This fourth embodiment of the processing tool which includes the resin bonded grindstone described above, is used in a fourth embodiment of the processing method which processes a work-piece. More particularly, the resin bonded grindstone is mounted on a vertical infeed grinding machine such as that shown in FIG. 1, and is used to grind the surface of the work-piece which is a 8-inch diameter silicon wafer which has already been lapped. By grinding the wafer surface for 30 seconds with a machining allowance of 30 μm, it was possible to obtain a processed surface having a high quality such that the surface roughness is 1 nm Ry or less and the processed surface is microcrack-free when viewed on the profile transmission electron microscope (TEM).

Next, a description will be given of further embodiments of the processing method according to the present invention and the processing apparatus according to the present invention, which are particularly suited for processing a circumferential part of a thin disk-shaped work-piece such as a semiconductor wafer. The work-piece may be made of semiconductor materials such as silicon, gallium arsenide and sapphire, hard and brittle materials such as quartz, glass and alumina-titanium carbide, and metals.

In order to facilitate the understanding of the embodiments described hereinafter, a description will first be given of the background technology.

A semiconductor wafer such as a silicon wafer is used as a substrate material for a semiconductor device. Polysilicon is used as the raw material, and a single crystal ingot is subjected to various processes before the silicon wafer (bear silicon wafer) is obtained. The actual production processes are described in a Japanese Laid-Open Patent Application No.5-13388, for example. In the production processes, there is a process of finishing the outer peripheral part of the wafer.

Unlike the flat top surface of the wafer, the outer peripheral surface of the wafer does not need to have an extremely high quality such that it is damage-free, since no devices are formed on the outer peripheral surface. Conventionally, the outer peripheral surface of the wafer is chamfered by a rough grinding process, and then subjected to a chemical etching to remove the damage. However, extremely small undulations and microcracks remain on the outer peripheral surface of the wafer which is processed in this manner. As a result, when the wafer is handled during the device producing process, cracks may be formed from the extremely small undulations, and foreign or dust particles may be generated from the microcracks. In addition, the strength of the wafer may deteriorate due to the existence of such cracks. Furthermore, when layers are formed on the wafer, abnormalities may be generated at layer portions in the vicinity of the outer peripheral surface of the wafer.

Hence, according to a technique proposed in a Japanese Laid-Open Patent Application No.5-13388, a polishing process is carried out by use of a polishing cloth after the chemical etching process, while supplying the slurry. The extremely small undulations and microcracks in the outer peripheral surface of the wafer can be reduced to an tolerable extent by carrying out such a polishing process. When carrying out this polishing process on the outer peripheral surface of the wafer, unwoven fabric or urethane foam is mainly used for the polishing cloth, as in the case of a polishing process carried out with respect to the flat top surface of. the wafer. In addition, colloidal silica slurry is mainly used as the slurry, as in the case of the polishing process carried out with respect to the flat top surface of the wafer.

On the other hand, in order to prevent undulations on the outer peripheral surface of the wafer from increasing due to the chemical etching process, a Japanese Laid-Open Patent Application No.8-236489 proposes a first proposed method which omits the chemical etching process. On the other hand, a mixed acid, such as a mixture of hydrofluoric acid, nitric acid and acetic acid, when used as a chemical etchant for the chemical etching process, causes environmental problems unless an appropriate waste water process is carried out. Hence, there is a second proposed method which uses an alkaline solution such as a sodium hydroxide solution as the chemical etchant. But in the case of the second proposed method, the undulations on the outer peripheral surface of the wafer tend to increase, and for this reason, the finishing process which is thereafter carried out with respect to the outer peripheral surface must remove an increased amount to remove the increased undulations. Accordingly, methods have been proposed to reduce the processing time, by carrying out a grinding process to a small extent prior to the polishing process, when carrying out the finishing process with respect to the outer peripheral surface of the wafer. Such methods are proposed in Japanese Laid-Open Patent Applications No.9-57584 and No.9-57585, for example.

As techniques related to the finishing process with respect to the outer peripheral surface of the wafer, various proposals have been made on the processing method and the processing apparatus which carry out a process on a workpiece, and the processing tool and the method of producing the processing tool which is used for such a process.

For example, processing methods and processing apparatuses which use a polishing cloth as the processing tool and carry out the finishing (polishing) process while supplying the slurry, are proposed in Japanese Laid-Open Patent Applications No.5-6881, No.5-23959, No.5-123952, No.5-243196, No.7-50279, No.9-94746, No.10-29142, No.10-71549, No.10-328989 and No.11-70450. In addition, the polishing cloth is proposed in a Japanese Laid-Open Patent Application No.5-152260, for example. A processing tool which is made of a material with a hardness greater than unwoven fabric or the like, such as cast iron and stainless steel, has also been proposed. But as noted in a Japanese Laid-Open Patent Application No.10-71549, for example, a mirror finishing is difficult by use of a processing tool which has a high hardness, and such a processing tool is suited for use in a rough grinding process rather than the finishing (polishing) process.

On the other hand, a linear cutout called an orientation flat is provided on the outer peripheral surface of the wafer. This orientation flat is used as a reference for the purpose of positioning the wafer or aligning the crystal orientation of the wafer when carrying out a device producing process. Recently, the cutout forming the orientation flat has become smaller, so as to enable a larger number of chips to be accommodated on one wafer. Moreover, an arcuate or V-shaped cutout called a notch is popularly used as the orientation flat. The cutout part can be made small by using the notch. Hence, there is a further advantage in that the balance of motion is improved when the wafer is rotated during various processes including a drying process.

The orientation flat part or the notch part has a shape quite different from the continuous outer peripheral surface of the wafer. For this reason, various processing methods and processing tools have been developed for the orientation flat part or the notch part, which are quite different from the processing methods and processing tools developed for the continuous outer peripheral surface of the wafer. For example, a Japanese Laid-Open Patent Application No.7-50279 proposes a technique which can improve the processing speed by using different polishing cloths for the outer peripheral surface and the orientation flat part of the wafer. In addition, methods and apparatuses for finishing the notch part are proposed in Japanese Laid-Open Patent Applications No.7-1322, No.8-168947 and No.8-236490. All of these methods and apparatuses basically use a polishing cloth as the processing tool, and carry out the finishing (polishing) process while supplying slurry. The Japanese Laid-Open Patent Application No.8-168947 also takes into consideration the use of a polishing belt or a polishing film as the processing tool.

The proposed methods and apparatuses described above carry out the loose-abrasive polishing process to finish the surface of the wafer using the polishing cloth while supplying the slurry. However, the loose-abrasive polishing process have problems in that the processing environment is harsh, the waste water must be processed, the running cost of the processing system is high, and the processing efficiency is low. For this reason, there are proposals to carry out the finishing (polishing) process on the wafer by a fixed-abrasive machining apparatus, that is, by use of a fixed-abrasive grinding tool.

Various processing methods and processing apparatuses which use a polishing film as the fixed-abrasive grinding tool, and techniques related thereto are proposed for example in Japanese Laid-Open Patent Applications No.7-100748, No.7-171749, No.7-237100 and No.8-168946.

For example, Japanese Laid-Open Patent Applications No.7-100748, No.7-124853, No.8-118226 and No.9-76148 propose processing methods and processing apparatus which use a polishing film as the processing tool for processing the orientation flat part or the notch part of the wafer.

Other processing methods use a grindstone as the fixed-abrasive grinding tool. Such processing methods are proposed in Japanese Laid-Open Patent Applications No.6-210520, No.7-58065, No.8-90401, No.8-197400 and No.10-189508, for example.

Therefore, the loose-abrasive polishing process which uses the polishing cloth and the slurry to finish the outer peripheral surface of the wafer have problems from the point of view of the waste water process which is required and the high running cost of the processing apparatus. In addition, the processing efficiency of the loose-abrasive polishing process is low in general, and it takes approximately 7 minutes to finish the outer peripheral surface of one wafer. Compared to other processes such as a lapping process carried out with respect to the top and bottom surfaces of one wafer which only requires approximately 1 to 2 minutes, it may be seen that the processing efficiency of the loose-abrasive polishing process is low. Accordingly, there are demands to improve the processing efficiency, by the use of a fixed-abrasive grinding tool such as the polishing film and the grindstone.

However, the conventional processing methods used to finish the outer peripheral surface of the wafer do not take into consideration the optimization of the processing tool used for each part of the wafer. In other words, the conventional processing methods change the conditions under which the processing tool is used with respect to specific parts of the wafer, but do not optimize the processing tool for each part of the wafer by changing the processing tool for each part of the wafer, for example. Because the processing tool is not optimized for each part of the wafer to be processed, the following problems occur.

In the case where the grindstone is used as the fixed-abrasive grinding tool, the grindstone must normally be moved at a tool speed on the order of several hundred m/min or greater in order to carry out a satisfactory grinding process. Accordingly, a high tool speed can be realized with respect to the outer peripheral surface of the wafer since it is possible to use a grindstone having a large diameter, but a sufficiently high tool speed cannot be realized with respect to the notch part of the wafer since it is only possible to use a grindstone having a small diameter. As a result, there are problems in that the wear of the grindstone is large, the tool life is short, the loading of the grindstone easily occurs, the shaping accuracy of the notch part easily deteriorates, and the quality of the processed surface is extremely poor at the notch part of the wafer as compared to that at the outer peripheral part of the wafer. It is conceivable to use a grindstone having a large diameter to process the notch part of the wafer, but in this conceivable case, it becomes necessary to control the grindstone so that a rotary axis of the grindstone becomes parallel to the wafer surface. But the outer peripheral surface of the wafer, including the notch part, is chamfered. For this reason, in order to process the wafer by controlling the rotary shaft of the grindstone to become parallel to the wafer surface, it would be necessary to carry out the grinding process separately at three locations, namely, the upper portion of the chamfered part, a central portion of the chambered part, and a lower portion of the chambered part of the wafer. As a result, it would be impossible to reduce the processing time.

On the other hand, compared to the grindstone, the capability of holding the abrasive grains and the strength or rigidity of the polishing film are low. In addition, the tool speed is relatively low in the case of the polishing film, and the removing efficiency realized by the polishing film is low as compared to that of the grindstone. As a result, when the polishing film is used to finish the entire outer peripheral surface of the wafer, it is impossible to reduce the processing time.

Problems similar to the problems described above with respect to the semiconductor wafer also occur when processing the outer peripheral surface of a disk or wafer made of materials such as metals and hard and brittle materials such as quartz, glass and alumina-titanium carbide. In the case of a donut-shaped glass disk, problems similar to those described above which are encountered when processing the outer peripheral surface and the cutout part of the wafer, also occur when processing an inner peripheral surface defining a center hole of the donut-shaped glass disk. Recently, the loose-abrasive polishing process is carried out with respect to the center hole of the glass disk in order to prevent generation of foreign or dust particles and to improve the mounting accuracy of the glass disk with respect to a disk unit. Consequently, the loose-abrasive polishing process carried out with respect to the center hole of the glass disk also results in problems in that the processing environment is harsh, the waste water must be processed, the running cost of the processing system is high, and the processing efficiency is low. Hence, it is conceivable to process the center hole of the glass disk by use of a grindstone, but in this case, it would only be possible to use a grindstone having a small diameter, similarly as when processing the cutout part at the outer peripheral surface of the wafer. Therefore, the use of the grindstone to process the center hole of the glass disk would result in problems in that a sufficiently high tool speed cannot be obtained and the wear of the grindstone is large.

On the other hand, Japanese Laid-Open Patent Applications No.9-123050, No.10-44007 and No.11-70450 point out a problem caused by the use of the polishing film or the polishing cloth. In other words, marks, scratches or the like matching a transport direction of the polishing film or the polishing cloth is inevitably formed on the processed surface.

According to the technique proposed in the Japanese Laid-Open Patent Application No.8-90401, a grindstone including silica abrasive grains is used to process the outer peripheral part of the wafer to a mirror finish, while supplying a water-soluble processing fluid. But according to the experiments conducted by the present inventors, it was confirmed that the use of the water-soluble processing fluid suppresses the mechano-chemical reaction of silica with respect to silicon, and the removing effect caused thereby is virtually lost, thereby making it extremely difficult to realize the desired polishing process. On the other hand, the Japanese Laid-Open Patent Application No.8-197400 proposes a technique which uses a grindstone made of fine abrasive grains and a elastic binder for the purposes of polishing the outer peripheral part of the wafer. However, in order to process the outer peripheral part of the wafer to a processed surface with a quality comparable to a mirror finish, the mechano-chemical processing is essential. Hence, it is extremely difficult to obtain a processed surface having a high quality solely by the mechanical removal as proposed in the Japanese Laid-Open Patent Application No.8-197400.

Accordingly, the further embodiments of the processing method according to the present invention and the processing apparatus according to the present invention are designed to eliminate the above described problems, and are particularly suited for processing a circumferential part of a thin disk-shaped work-piece such as a semiconductor wafer.

Figure 3:
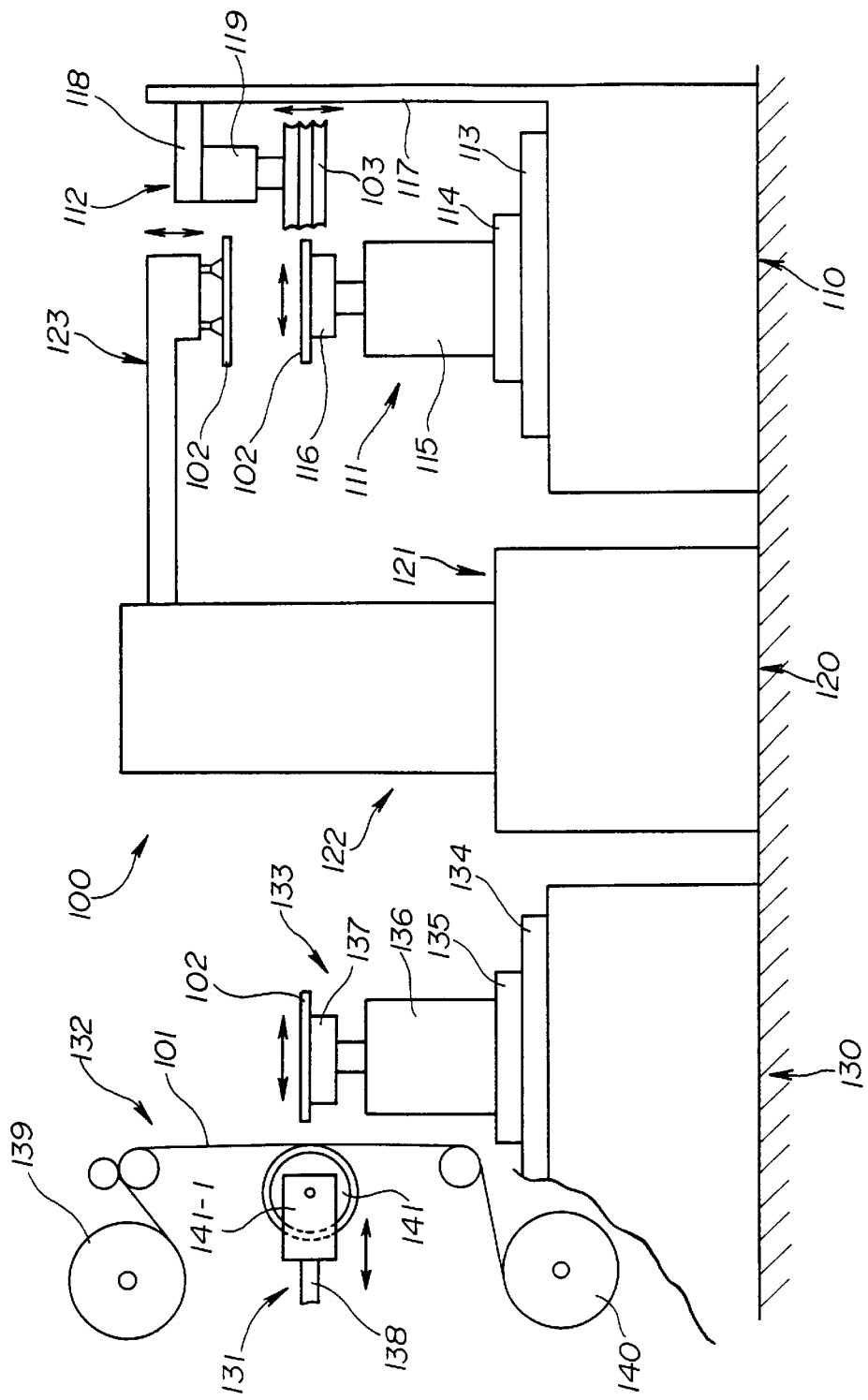
FIG. 3 is a diagram showing the general construction of a fifth embodiment of the processing apparatus according to the present invention.

FIG. 3 is a diagram showing the general construction of a fifth embodiment of the processing apparatus according to the present invention. This fifth embodiment of the processing apparatus employs a fifth embodiment of the processing method according to the present invention.

A processing apparatus 100 shown in FIG. 3 includes a grinding unit 110, a transport unit 120, and a film polishing unit 130 which are arranged on mutually independent blocks and are independently controllable by a controller (not shown).

The grinding unit 110 includes a work moving section 111 and a grinding section 112 which are both mounted on a base of the corresponding block.

In the work moving section 111, a slide table 114 is slidably provided on a pair of guide rails 113 which are provided on the base of the corresponding block. The slide table 113 is slidable in horizontal directions indicated by arrows in FIG. 3. A mechanism (not shown) for moving the slide table 114 may be realized by a known means such as a structure which rotates an integrated guide-and-ball-screw by a motor, or a rack and pinion structure.

A work rotating motor 115 which is linked to a work table 116 is fixed on theslide table 114. A plurality of vacuum suction pads (not shown) are provided in the work table 116. A disk-shaped work-piece 102, such as a disk and a wafer, is placed and positioned on the work table 116 by the transport unit 120, and is held in position on the work table 116 under suction from under the work table 116 via the vacuum suction pads.

In the grinding section 112, a frame 117 is provided on one side of the guide rails 113, opposite to the transport unit 120. A pair of guide rails (not shown) extend vertically on the frame 117, and a slider 150 is slidably supported on these vertical guide rails. An elevator mechanism (not shown) which moves the slider 150 up and down, may be realized by a known means such as a structure which rotates an integrated guide-and-ball-screw by a motor, or a rack and pinion structure.

A grinding motor 119 is fixed on the slider 150. A grindstone 103 is linked to a rotary shaft of the grinding motor 119.

The grindstone 103 is made of abrasive grains which generate a mechano-chemical reaction when used to polish a surface of the work-piece 102 or, made of a binder mixture such as resins, ceramics and metals which include such abrasive grains. An average grain diameter of the abrasive grains is set in a range of 0.8 nm to 10 μm. If the average grain diameter used for the grindstone 103 is less than 0.8 nm, the mechanical action on the work-piece 102 becomes too small, and a desired mechano-chemical reaction cannot be generated. On the other hand, if the average grain diameter used for the grindstone 103 exceeds 10 μm, the mechanical action becomes too large, and there is a possibility of generating damage to the outer peripheral surface of the work-piece 102 which is processed.

Figure 4:
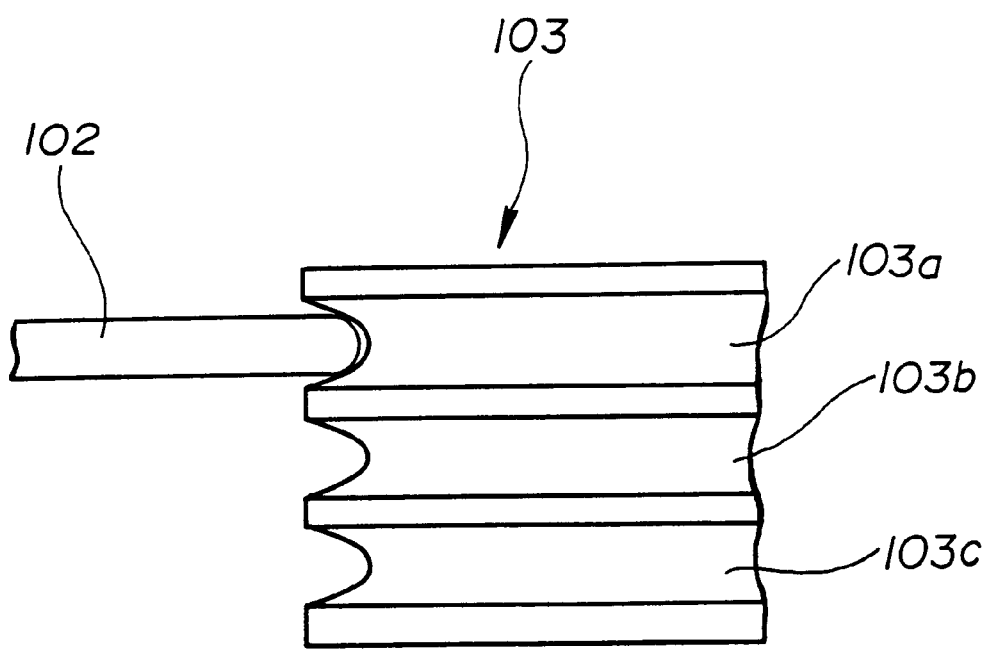
FIG. 4 is a side view showing the shape of a grindstone.

For example, the method described above may be employed to produce the grindstone 103 which includes silica abrasive grains. In this embodiment, the grindstone 103 has a multi-level structure as shown in FIG. 4. A plurality of tapered grooves 103a through 103c are formed on the outer peripheral surface of the cylindrical grindstone 103. When polishing the outer peripheral surface of the work-piece 102, the outer peripheral surface of the work-piece 102 is pushed against one of the tapered grooves 103a through 103c of the grindstone 103. As the grindstone 103 wears out due to friction, the tapered groove which is used for the polishing process may be appropriately changed among the tapered grooves 103a through 103c.

As described above and in Japanese Laid-Open Patent Application No.2000-190228 and Japanese Patent Application No.11-82171, for example, silica abrasive grains are used as the abrasive grains which generate the mechano-chemical reaction when used to polish the surface of the work-piece 102 which is made of silicon. However, it is also possible to use grains made of other materials, such as barium carbonate grains, as the abrasive grains which generate the mechano-chemical reaction. Furthermore, when the work-piece 102 is made of glass, for example, it is possible to use cerium oxide grains as the abrasive grains which generate the mechano-chemical reaction.

The transport unit 120 has a swivel shaft mounted on the corresponding block or the floor. The transport unit 120 includes a robot hand (or a link section) 123, a pivot section 121 which turns the link section 123 in a horizontal direction, and a slider section 122 which is arranged on the pivot section 121 and moves the link section 123 up and down. One end of the link section 123 is linked to the pivot section 121 and the slider section 122, and the other end of the link section 123 is provided with vacuum suction pads.

For example, the pivot section 121 transmits a torque generated from a D.C. servo motor to the link section 123 via a gear mechanism (not shown). A rotary angle of the link section 123 is obtained in the form of an electrical signal which is fed back to the controller described above.

For example, the slider section 122 rotates a ball screw, a continuous-thread screw or the like by a D.C. servo motor, and transforms this rotary motion into a linear motion via a slide bearing, a rod and the like. A moving distance of the link section 123 which moves up and down, is obtained in the form of an electrical signal which is fed back to the controller described above.

Manipulation functions such as moving, positioning and fixing the work-piece 102 are realized by the feedback control based on the driven amounts of the link section 123, the pivot section 121 and the slider section 122. In other words, the work-piece 102 is transported by a belt conveyor or the like from a previous processing stage (not shown), and is moved and placed one by one on the work table 116 of the grinding unit 110. On the other hand, the work-piece 102 after being ground of the outer peripheral surface by the grinding unit 110 is moved and placed on a work table 137 of the polishing unit 130.

The polishing unit 130 includes a work moving section 133 and a polishing section 132 which are both mounted on a based on the corresponding block.

In the work moving section 133, a slide table 135 is slidably provided on a pair of guide rails 134 which are provided on the base of the corresponding block. The slide table 135 is slidable in horizontal directions indicated by arrows in FIG. 3. A mechanism (not shown) for moving the slide table 135 may be realized by a known means such as a structure which rotates an integrated guide-and-ball-screw by a motor, or a rack and pinion structure.

A work rotating motor 136 which is linked to the work table 137 is fixed on the slide table 135. For example, a stepping motor may be used for the work rotating motor 136. A plurality of vacuum suction pads (not shown) are provided in the work table 137. The work-piece 102 is placed and positioned on the work table 137 by the transport unit 120, and is held in position on the work table 137 under suction from under the work table 137 via the vacuum suction pads.

Figure 5:
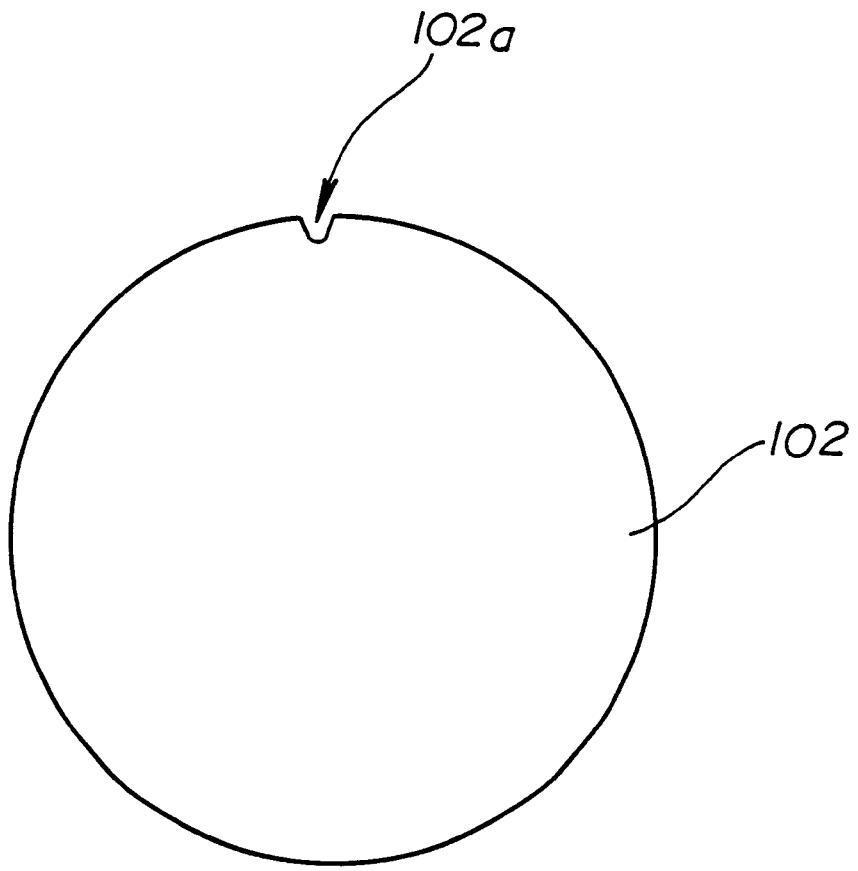
FIG. 5 is a plan view showing a disk which is processed.

In the polishing section 132, a tape-shaped polishing film 101 is wound on a supply reel 140 in a state free to be supplied therefrom, and the supplied polishing film 101 is taken up on a take-up reel 139 via a pressing roller 141. Motors (not shown) which drive the supply reel 140 and the take-up reel 139 are both rotatable in forward and reverse directions. By controlling the two motor in synchronism, the polishing film 101 is transported upwards and downwards in FIG. 3 to polish the work-piece 102 which is positioned and held on the work table 137. More particularly, the polishing film 101 presses against a cutout part 102a of the work-piece 102 shown in FIG. 5 on the work table 137 while being transported upwards and downwards, to polish the cutout part 102a.

Figure 6:
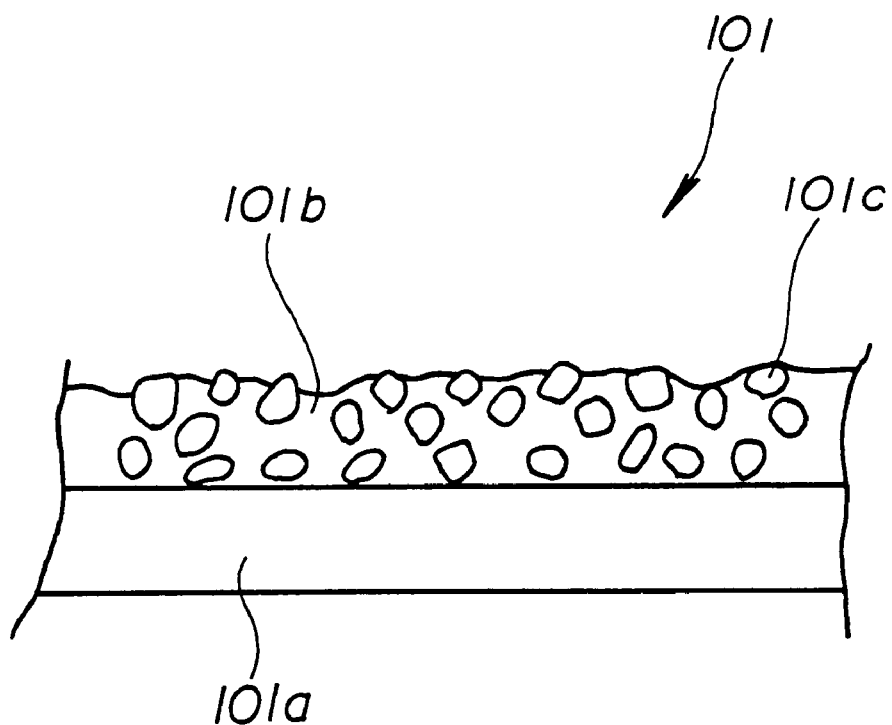
FIG. 6 is a cross sectional view showing a polishing film.

As shown in FIG. 6, the polishing film 101 includes a resin film 101a which forms the base material, and a binder resin 101b which includes abrasive grains 101c which generate the mechano-chemical reaction when processing the surface of the work-piece 102. The binder resin 101b is coated on the resin film 101a, and then dried and cured. For the reasons described above, the average grain diameter of the abrasive grains 101c is set in a range of 0.8 nm to 10 µm. For example, the method described above may be employed to produce the polishing film 101 which includes silica abrasive grains as the abrasive grains 10c. Silica abrasive grains are used as the abrasive grains 101c which generate the mechano-chemical reaction when used to polish the surface of the work-piece 102 which is made of silicon. However, it is also possible to use grains made of other materials, such as barium carbonate grains, as the abrasive grains 101c which generate the mechano-chemical reaction. Furthermore, when the work-piece 102 is made of glass, for example, it is possible to use cerium oxide grains as the abrasive grains 101c which generate the mechano-chemical reaction.

When carrying out the polishing process, the side of the polishing film 101 having the abrasive grains 101c is pressed against the cutout part 102a of the work-piece 102 by the pressing roller 141. The cutout part 102a is polished by transporting the polishing film 102 upwards and/or downwards in FIG. 3. A width (tape width) of the polishing film 101 is set slightly larger than a width of the cutout part 102a.

A pressing unit 131 includes a frame 141-1 which is provided on the side of the polishing film 101 having the resin film 101a and rotatably supports the pressing roller 141, an air cylinder 138 which can move the frame 141-1 in the right and left directions, and a swinging mechanism which uses a driving motor (not shown) to swing or rotate the frame 141-1 in a back and forth direction which is perpendicular to the transport direction of the polishing film 101. The pressing roller 141 is made of a resilient material or at least the outer periphery of the pressing roller 141 is sufficiently compliant. The outer peripheral shape, thickness and the like of the pressing roller 141 correspond to those of the cutout part 102a. The air cylinder 138 is controlled by the controller described above, so that a polishing pressure of the polishing film 101 becomes a predetermined value. When carrying out the polishing process, the frame 141-1 is pushed so as to press the polishing film 101 against the work-piece 102.

Details of the grinding unit 110 and the polishing unit 130 may be found in Japanese Laid-Open Patent Applications No.8-90401 and No.9-76148, for example.

The work-piece 102 may be positioned based on an image recognition made with respect to the top surfaces of the work tables 116 and 137 using a sensor, such as a television camera, a CCD image sensor and a vidicon. In this case, an image recognition result is processed on a personal computer or the like, and a center coordinate of the work-piece 102 is obtained with reference to marks which are provided beforehand on the work tables 116 and 137. The movement of the link section 123 is controlled based on the obtained center coordinate. On the other hand, a sensor (not shown) is mounted on a tip end of the link section 123, so that by recognizing the image of the work-piece 102 which is held, a positioning mechanism can finely adjust the relative positions of the work-piece 102 relative to the work tables 116 and 137. This type of a positioning mechanism is described in a Japanese Laid-Open Patent Application No.11-207611, for example.

Next, a description will be given of this fifth embodiment of the processing method which finishes the outer peripheral surface of the work-piece 102. It is assumed for the sake of convenience that the work-piece 102 is a disk which includes the cutout part (notch part) 102a and has already been subjected to a pre-processing at a previous processing stage including at least a chamfering process, a lapping process and an etching process such as a chemical etching process.

This fifth embodiment of the processing method includes a grinding step which grinds the outer peripheral surface of the work-piece 102, that is, the circumferential surface of the disk, and a polishing step which polishes the cutout part 102a on the outer circumferential surface of the work-piece 102.

First, a description will be given of the grinding step.

In the transport unit 120, the work-piece 102 which is transported from the previous processing stage by the conveyor belt or the like is held by the link section 123 under suction via the vacuum suction pads, and is moved and placed one by one on the work table 116 of the grinding unit 110. In this state, the slide table 114 is locked by a locking mechanism (not shown) so as to stop at a predetermined position. A position alignment is made so that in the state where the work table 116 is stationary, the center of rotation of the work table 116 and the center of the work-piece 102 match.

Next, in the grinding unit 110, the work-piece 102 which is aligned of its position is held on the work table 116 by the vacuum suction pads of the work table 116. The slide table 114 and the slider 150 are moved, so as to position the grindstone 103 and the work-piece 102 to predetermined positions.

Then, the work table 116 and the grindstone 103 are rotated, and the slide table 114 is moved in a horizontal direction towards the grindstone 103, so that the outer circumferential surface of the work-piece 102 contacts one of the tapered grooves 103a through 103c of the grindstone 103. Furthermore, the slide table 114 is moved by a predetermined quantity, so as to form a chamfered part of the work-piece 102 into a mirror finish.

After the mirror finishing process ends, the rotations of the work table 116 and the grindstone 103 are stopped. In addition, the slide table 114 is moved in a horizontal direction towards the transport unit 120 and stopped at a predetermined waiting position.

Next, a description will be given of the polishing step.

After the grinding process, the pivot section 121 of the transport unit 120 turns the link section 123 by a predetermined amount towards the grinding unit 110, and further, the slider section 122 lowers the link section 123 by a predetermined amount. By this operation to turn and lower the link section 123, the vacuum suction pads of the link section 123 make contact with the work-piece 102 on the work table 116. The work-piece 102 is thus held under suction from above by the vacuum suction pads of the link section 123, and the suction from under the work table 116 is released.

Next, after the slider section 122 raises the link section 123 by a predetermined amount, the pivot section 121 turns the link section 122 by a predetermined amount towards the film polishing unit 130. Moreover, the slider section 122 lowers the link section 123 by a predetermined amount, and moves and places the work-piece 102 which is held under suction by the link section 123 onto the work table 137. In this state, a position alignment is made so that the center of rotation of the work table 137 and the center of the work-piece 102 match, and the outer periphery of the pressing roller 141 and the cutout part 102a of the work-piece 102 confront each other. When making this position alignment, the work table 137 is turned if necessary.

Then, in the film polishing unit 130, the work-piece 102 which is aligned of its position is held by the vacuum suction pads of the work table 137 from under the work-piece 102, and the suction of the link section 123 is released. Thereafter, the slider section 122 raises the link section 123 by a predetermined amount, and the pivot section 121 turns the link section 123 by a predetermined amount towards the grinding unit 110.

Next, the slide table 135 is moved by a predetermined amount towards the polishing section 132, so as to move the work-piece 102 close to the pressing roller 141. Thereafter, the air cylinder 138 is driven, so that the polishing film 101 which is pushed by the pressing roller 141 presses against the cutout part 102a of the work-piece 102 at a predetermined polishing pressure.

Then, the take-up reel 139 and the supply reel 140 are driven to transport the polishing film 101 vertically, back and forth, so as to polish the cutout part 102a by the polishing film 101 which is pushed by the pressing roller 141. In this state, a boundary between the cutout part 102a and the outer circumferential part of the work-piece 102 is polished by rotating the work table 137 in the forward and reverse directions by a necessary amount. In addition, the frame 141-1 is made to swing up and down if necessary, by the driving motor and the swinging mechanism described above.

After polishing the cutout part 102a of the work-piece 102, the driving of the take-up reel 139, the supply reel 140 and the air cylinder 138 are stopped, so that the pressing roller 141 recedes from the polishing position.

The pivot section 121 of the transport unit 120 then turns the link section 123 by a predetermined amount towards the film polishing unit 130, and the slider section 122 lowers the link section 123 by a predetermined amount. By this turning and lower operation, the vacuum suction pads of the link section 123 makes contact with the work-piece 102 on the work table 137 and holds the work-piece 102 from above by suction. Further, the suction from under the work table 137 is released.

Next, after the slider section 122 raises the link section 123 by a predetermined amount, the pivot section 121 turns the link section 123 towards the next processing stage (not shown). For example, the next processing stage carries out an air cleaning process with respect to the work-piece 102 which is transported thereto.

According to this embodiment, the polishing film 101 is transported in directions perpendicular to the top or bottom surface of the work-piece 102. However, it is of course possible to transport the polishing film 101 in a direction parallel to the top or bottom surface of the work-piece 102. Such a parallel transport of the polishing film is proposed in a Japanese Laid-Open Patent Application No.7-124853, for example.

Moreover, this embodiment was described above along the transport path through which the work-piece 102 is transported. However, since the block of the grinding unit and the block of the film polishing unit are independent of each other, it is of course possible to carry out the control so that the grinding unit and the film polishing unit carry out the processes simultaneously with respect to two different work-pieces.

Figure 7:
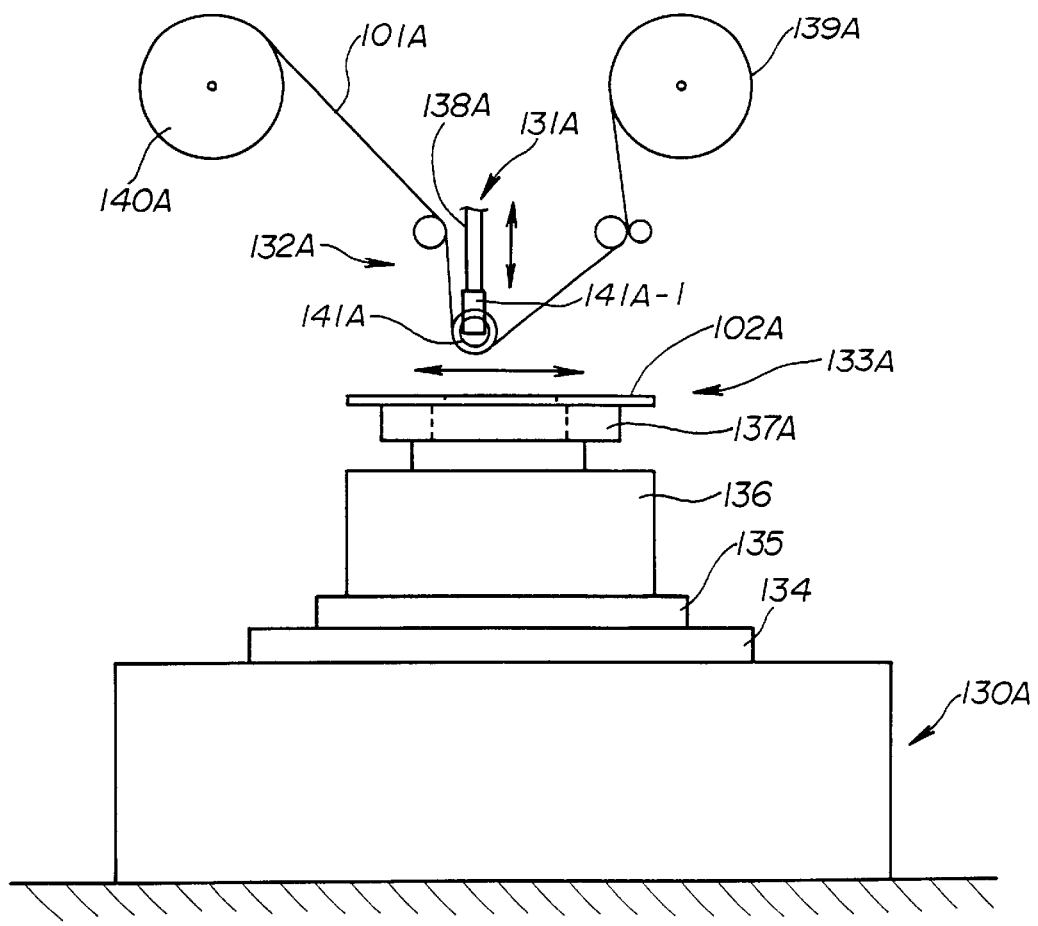
FIG. 7 is a diagram showing the general construction of a sixth embodiment of the processing apparatus.

Next, a description will be given of a sixth embodiment of the processing apparatus according to the present invention, by referring to FIG. 7. FIG. 7 is a diagram showing the general construction of the sixth embodiment of the processing apparatus according to the present invention.

This sixth embodiment of the processing apparatus employs a sixth embodiment of the processing method according to the present invention. In FIG. 7, those parts which are the same as those corresponding parts in FIG. 3 are designated by the same reference numerals, and a description thereof will be omitted.

In this sixth embodiment, the present invention is applied to the processing of a peripheral surfaces of a donut-shaped work-piece such as a glass disk. More particularly, the film polishing unit 130 shown in FIG. 3 is replaced by a film polishing unit 130A shown in FIG. 7. After the outer circumferential surface of a donut-shaped work-piece 102A is processed by the grinding unit 110 shown in FIG. 3, the film polishing unit 130A processes the inner peripheral surface defining the center hole in the donut-shaped work-piece 102A.

In a work moving section 133A of the film polishing unit 130A, a slide table 135 is slidably provided on a pair of guide rails 134 which are provided on the base of the corresponding block. The slide table 135 is slidable in horizontal directions indicated by arrows in FIG. 7. A mechanism (not shown) for moving the slide table 135 may be realized by a known means such as a structure which rotates an integrated guide-and-ball-screw by a motor, or a rack and pinion structure.

A work rotating motor 136 which is linked to a work table 137A is fixed on the slide table 135. For example, a stepping motor may be used for the work rotating motor 136. The work table 137A has a center opening which is larger than the center hole of the work-piece 102A, and a plurality of vacuum suction pads (not shown) on the outer periphery of the center opening. In a plan view, an inner peripheral surface defining the center opening of the work table 137A surrounds the inner peripheral surface defining the center hole in the work-piece 102A. The work-piece 102A is held in position on the work table 137A under suction from under the work table 137A via the vacuum suction pads.

In a polishing section 132A, a tape-shaped polishing film 101A is wound on a supply reel 140A in a state free to be supplied therefrom, and the supplied polishing film 101A is taken up on a take-up reel 139A via a pressing roller 141A. Motors (not shown) which drive the supply reel 140A and the take-up reel 139A are both rotatable in forward and reverse directions. By controlling the two motor in synchronism, the polishing film 101A is transported to the left and right between the supply and take-up reels 140A and 139A in FIG. 7 to polish the inner peripheral surface defining the center hole of the work-piece 102A which is positioned and held on the work table 137A. More particularly, the work-piece 102A on the work table 137A is rotated at a predetermined speed by the work rotating motor 136, while the pressing roller 141A pushes the polishing film 101A against the inner peripheral surface defining the center hole of the work-piece 102A, so that the inner peripheral surface of the work-piece 102A is polished by the polishing film 101A. A tape width of the polishing film 101A is smaller than a diameter of the center hole of the work-piece 102A but larger than a width of the pressing roller 141A. The polishing film 101A can be produced in the same manner as the polishing film 101 of the fifth embodiment described above. In this sixth embodiment, cerium oxide grains are used as the abrasive grains 101c which generate the mechano-chemical reaction when processing the work-piece 102A.

A pressing unit 131A includes a frame 141A-1 which is provided on the base material side of the polishing film 101A and rotatably supports the pressing roller 141A, an air cylinder 138A which moves the frame 141A-1 back and forth in perpendicular directions towards the paper and from the paper in FIG. 7 and up and down in vertical directions in FIG. 7, and a swinging mechanism (not shown). The switching mechanism uses a driving motor (not shown) to swing the frame 141A-1 in directions to the left and right in FIG. 7. The pressing roller 141A is made of a resilient or sufficiently compliant material. The outer peripheral shape, thickness and the like of the pressing roller 141A are set correspondingly to the shape of the inner peripheral surface of the work-piece 102A. The air cylinder 138A moves the frame 141A-1 in a manner described above, so as to push the abrasive grain side of the polishing film 101A by the pressing roller 141A against the inner peripheral surface of the work-piece 102A.

When carrying out the polishing process with respect to the inner peripheral surface of the work-piece 102A, the work-piece 102A having the outer peripheral surface thereof already subjected to the grinding process by the grinding unit 110 is transported by the transport unit 120 to the film polishing unit 130A, similarly as in the case of the fifth embodiment described above. The position of the transported work-piece 102A is aligned so that the center of rotation of the work table 137A matches the center of the work-piece 102A, and the outer periphery of the pressing roller 141A confronts the inner peripheral surface of the work-piece 102A.

Next, in the film polishing unit 130A, the work-piece 102A which is aligned of its position is held on the work table 137A by suction via the vacuum suction pads. Thereafter, the air cylinder 138A is driven to appropriately move the frame 141A-1 up, down, right and/or left by predetermined amounts, so as to make the pressing roller 141A approach the inner peripheral surface of the work-piece 102A. As a result, the pressing roller 141A makes the polishing film 101A contact the inner peripheral surface of the work-piece 102A with a predetermined polishing pressure.

Then, the take-up reel 139A and the supply reel 140A are driven to transport the polishing film 101A left and right, while rotating the work table 137A at a predetermined speed, so as to polish the inner peripheral surface of the work-piece 102A. In addition, the swinging mechanism and the driving motor swing the frame 141A-1 back and forth towards the paper and away from the paper in FIG. 7, if necessary.

After polishing the inner peripheral surface of the work-piece 102A, the driving of the take-up and supply reels 139A and 140A, the rotating of the work table 137A, and the driving of the air cylinder 138A are stopped, so as to make the pressing roller 141A recede from the polishing position.

Next, the transport unit 120 shown in FIG. 3 transports the work-piece 102A which has been subjected to the processes in the grinding unit 110 and the film polishing unit 130A to the an air cleaning unit (not shown) which carries out the next air cleaning process with respect to the work-piece 102A.

According to the fifth and sixth embodiments, the grindstone 103 is used to process the outer peripheral part of the work-pieces 102 and 102A having the relatively large processing surface. Since the grindstone 103 may have a large diameter, it is possible to obtain a sufficiently high tool speed when processing the outer peripheral part of the work-pieces 102 and 102A. In addition, the flexible polishing film 101 is used to process the cutout part (notch part) 102a of the work-piece 102 having the relatively small processing surface and a more complicated shape. The flexible polishing film 101A is used to process the inner peripheral part of the work-piece 102A having a relatively small processing surface, such that the diameter of the tool usable for the inner peripheral part is small compared to that usable for the outer peripheral part. Therefore, it is possible to stably process the surfaces of the work-pieces 102 and 102A with a high efficiency. Fresh unworn parts of the polishing films 101 and 101A can always be used by merely controlling the supply reel 140 or 140A and the take-up reel 139 or 139A, thereby preventing the loading.

Moreover, the grindstone 103 and the polishing films 101 and 101A used in the fifth and sixth embodiments may be made of abrasive grains which generate the mechano-chemical reaction when processing the surface of the work-piece 102 or 102A, such as silica abrasive grains, barium carbonate abrasive grains and cerium oxide abrasive grains. By using such abrasive grains, it is possible to obtain a high-quality processed surface comparable to that obtained by the conventional loose-abrasive polishing process, even when applied to the fixed-abrasive grinding tool.

In addition, the fifth and sixth embodiments carry out a dry grinding process and a dry polishing process. A mechano-chemical process can be carried out by use of the abrasive particles which generate the mechano-chemical reaction when processing the work-piece. At the same time, it is possible to suppress the deterioration of the working environment and the increase of the running cost which would otherwise occur due to the need to supply processing fluids such as the slurry and carry out the waste water process.

Further, the fifth and sixth embodiments can not only carry out the mechano-chemical process, but also prevent marks, scratches and the like from being formed on the processed surface of the work-piece in the transport direction of the polishing film or the like.

It was confirmed through experiments conducted by the present inventors that the outer peripheral part, the cutout part of the outer peripheral part and the inner peripheral part of a 8-inch diameter silicon wafer can be processed to a mirror finish comparable to that obtained by use of the conventional loose-abrasive polishing process when the grindstone 103 and the polishing film 101 or 101A having the following characteristics. That is, silica abrasive grains having a primary average grain diameter of 20 nm was used as the abrasive grains. In addition, a resin bonded grindstone using a phenol resin as the binder was used for the grindstone 103. Moreover, a film which uses a polyethylene telephthalate as the base material and an urethane resin as the binder was used as the polishing film 101 or 101A. It was possible to complete the processing on the outer peripheral part of the silicon wafer in 1 minute, starting from the transport of the silicon wafer into the processing apparatus 100 to the transport of the processed wafer out from the processing apparatus 100. This processing time of 1 minute is extremely short when compared to 7 minutes which would be required to carry out a similar process on the outer peripheral part of the silicon wafer by the conventional loose-abrasive polishing process. Furthermore, no marks, scratches and the like were formed on the processed surface of the silicon wafer in the transport direction of the polishing film 101 or 101A.

Further, the present invention is not limited to these embodiments, but various variations and modifications may be made without departing from the scope of the present invention.

What is claimed is:

1. A processing system comprising:

a processing tool in combination with a silicon work-piece, the processing tool being for carrying out a fixed-abrasive grinding process on a surface of the silicon work-piece, and the processing tool including abrasive grains made up of silica grains such that when the fixed-abrasive process is being performed on the surface of the silicon work-piece, a dry mechano-chemical reaction occurs between the abrasive grains and the silicon work-piece so that the processing tool processes the silicon work-piece without supplying a processing fluid or coolant.

2. The processing system as claimed in claim 1, wherein the abrasive grains form a grindstone.

3. The processing system as claimed in claim 1, wherein the abrasive grains form a film.

4. The processing system as claimed in claim 3, wherein the film is flexible.

5. A method for carrying out a fixed-abrasive grinding on a surface of a silicon work-piece, the method comprising the steps of:

positioning the silicon work-piece relative to a processing tool having abrasive grains made up of silica grains; and processing the surface of the silicon work-piece by the abrasive grains of the processing tool such that when the fixed-abrasive process is being performed on the surface of the silicon work-piece, a dry mechano-chemical reaction occurs between the abrasive grains and the silicon work-piece so that the processing tool processes the silicon work-piece without supplying a processing fluid or coolant.

6. A processing tool and silicon work-piece in combination, comprising:

the processing tool for carrying out a fixed-abrasive grinding process on a surface of the silicon work-piece, wherein the processing tool includes abrasive grains made up of silica grains such that when the fixed-abrasive grinding process is being performed on the surface of the silicon work-piece, a dry mechano-chemical reaction occurs between the abrasive grains and the silicon work-piece so that the processing tool processes the silicon work-piece without supplying a processing fluid or coolant.

7. The processing tool and silicon work-piece in combination as claimed in claim 6, wherein the abrasive grains form a grindstone.

8. The processing tool and silicon work-piece in combination as claimed in claim 6, wherein the abrasive grains form a film.

9. The processing tool and silicon work-piece in combination as claimed in claim 8, wherein the film is flexible.

* * * * *

UNITED STATES PATENT AND TRADEMARK OFFICE
CERTIFICATE OF CORRECTION

PATENT NO. : 6,685,539 B1  Page 1 of 1
DATED : February 3, 2004
INVENTOR(S) : Toshiyuki Enomoto et al.

It is certified that error appears in the above-identified patent and that said Letters Patent is hereby corrected as shown below:

<u>Title page, Item [54] and Column 1, lines 1-3,</u>
Title, should read:
-- [54] PROCESSING SYSTEM INCLUDING PROCESSING TOOL AND SILICON WORK-PIECE IN COMBINATION AND METHOD FOR CARRYING OUT FIXED-ABRASIVE GRINDING PROCESS ON SILICON WORK-PIECE. --

Signed and Sealed this

Eighteenth Day of May, 2004

JON W. DUDAS
*Acting Director of the United States Patent and Trademark Office*

UNITED STATES PATENT AND TRADEMARK OFFICE
Certificate

Patent No. 6,685,539 B1  Patented: February 3, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Toshiyuki Enomoto, Tokyo, (JP); and Yasuhiro Tani, Tokyo, (JP).

Signed and Sealed this Twelfth Day of June 2007.

JOSEPH J. HAIL III
*Supervisory Patent Examiner*
Art Unit 3723